US011177795B1

(12) United States Patent
Liu et al.

(10) Patent No.: US 11,177,795 B1
(45) Date of Patent: Nov. 16, 2021

(54) MASTER LATCH DESIGN FOR SINGLE EVENT UPSET FLIP-FLOP

(71) Applicant: XILINX, INC., San Jose, CA (US)

(72) Inventors: Jun Liu, San Jose, CA (US); Bruce Young, Gilroy, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/855,962

(22) Filed: Apr. 22, 2020

(51) Int. Cl.
*H03K 3/037* (2006.01)

(52) U.S. Cl.
CPC ......... *H03K 3/0372* (2013.01); *H03K 3/0375* (2013.01)

(58) Field of Classification Search
CPC .... H03K 3/037; H03K 3/0375; H03K 3/0377; H03K 3/356; H03K 3/356069; H03K 3/356104; H03K 3/356165; H03K 3/3562; H03K 3/35625
See application file for complete search history.

(56) References Cited

U.S. PATENT DOCUMENTS

| | | | |
|---|---|---|---|
| 9,013,219 B2* | 4/2015 | Cabanas-Holmen | H03K 3/012 327/202 |
| 9,054,684 B1 | 6/2015 | Sood et al. | |
| 9,281,807 B1* | 3/2016 | Maillard | H03K 3/356156 |
| 9,344,067 B1 | 5/2016 | Wu et al. | |
| 2007/0013425 A1* | 1/2007 | Burr | G11C 11/412 327/208 |
| 2015/0091627 A1* | 4/2015 | Sharma | H03K 3/0375 327/218 |

OTHER PUBLICATIONS

Sheshadri, Vijay B., "Upset Trends in Flip-Flop Designs at Deep Submicron Technologies", Thesis submitted to the faculty of the Graduate School of Vanderbilt University, Dec. 2010 (43 pages).

* cited by examiner

*Primary Examiner* — Long Nguyen
(74) *Attorney, Agent, or Firm* — Patterson + Sheridan, LLP (57) ABSTRACT

A master latch includes a latch input node and a latch output node, a first inverter with an input and an output, the input coupled to the latch input node and the output coupled to the latch output node, and a second inverter with an input and an output, the input coupled to the latch output node and the output coupled to the latch input node. The master latch further includes a first pull-up device connected between a source voltage and the latch input node, the first pull-up device configured to pull the latch input node up towards the source voltage when the latch output node is low, and a first pull-down device connected between the latch input node and a ground voltage, the first pull-down device configured to pull the latch input node towards the ground voltage when the latch output node is high.

18 Claims, 8 Drawing Sheets

FIG. 1 – PRIOR ART

| | Net | Critical Current (uA) | Latch Fails at Current (uA) |
|---|---|---|---|
| 210 | Q1_iq | 170 | 175 |
| 220 | Q1_iqb | 105 | 110 |
| 230 | Q0_iq | 185 | 190 |
| 240 | Q0_iqb | 115 | 120 |

Key:
iq = current at mq 115
Iqb = current at mqb 113
Q1 = node mq115 is "1"
Q0 = node mq 115 is "0"

| Net | Critical Current (uA) |
|---|---|
| Q1_iq   410 | 280 |
| Q1_iqb  420 | 230 |
| Q0_iq   430 | 300 |
| Q0_iqb  440 | 205 |

Key:
iq = current at mq 115
iqb = current at mqb 113
Q1 = node mq115 is "1"
Q0 = node mq 115 is "0"

- 610 Provide a master latch including a first inverter and a second inverter, the output of the first inverter coupled to an output of the latch and to an input of the second inverter, and the output of the second inverter coupled to the input of the first inverter and to an input of the latch

- 620 Provide a third inverter whose output is connected to the input of the first inverter and the output of the second inverter, and whose gates are connected to the input of the second inverter and the output of the first inverter

- 630 Provide a fourth inverter whose output is connected to the input of the second inverter and the output of the first inverter, and whose gates are connected to the input of the first inverter and the output of the second inverter

- 640 Connect the master latch to a slave latch, the slave latch implemented with a dual-interlocked cell configuration

MASTER LATCH DESIGN FOR SINGLE EVENT UPSET FLIP-FLOP

TECHNICAL FIELD

Examples of the present disclosure generally relate to flip-flop circuits, and in particular to a single event upset (SEU) protected master latch.

BACKGROUND

Integrated circuits often contain volatile data storage elements. Typical volatile storage elements may be based on cross-coupled inverters, such as, for example, latches. A volatile storage element retains data only so long as the integrated circuit is powered. Thus, in the event of loss of power, any data stored in the volatile storage element is lost. For example, a volatile storage element such as a flip-flop circuit includes a master latch and a slave latch, where each of the master and the slave latches includes a pair of cross-coupled inverters. Such types of volatile storage elements are subject to the SEU phenomenon.

SEU events are caused by cosmic rays, as well as radioactive impurities that may be embedded in integrated circuits and their packages. Cosmic rays and radioactive impurities generate high-energy atomic particles such as, for example, neutrons and alpha particles. Data storage elements generally include transistors and other components that are formed from a patterned silicon substrate. When an atomic particle strikes the silicon in the storage element, electron-hole pairs are generated. The electron-hole pairs create a conduction path that can cause a charged node in the storage element to discharge, and thus the state of the storage element to flip. If, for example, a "1" was stored in the storage element, an SEU event could cause the stored "1" to change to a "0", creating an error.

Upset events in an integrated circuit that corrupt the data stored in the storage elements can have serious repercussions on system performance. Accordingly, flip-flops are built to have certain protections against SEU events. For example, conventional SEU flip-flops generally include a standard master latch (e.g., a pair of cross-connected inverters) and a dual interlocked storage cell (DICE) slave latch. However, in this design, while the slave latch is, in fact, SEU protected, the master latch is not. As a result, the master latch portion of the conventional flip-flop has a higher failure in time (FIT) rate, when compared to the slave latch portion.

Because, as noted, conventionally master latches are made of a simple cross-coupled inverter design, it is highly likely that a radiation strike on a given inverter's input node will cause the inverter's output node to change states. This, in turn, causes the latch to have an erroneous value.

It is thus useful to solve these vulnerabilities of conventional flip-flops to SEU events.

SUMMARY

Examples described herein relate to a master latch for SEU flip-flops. By adding redundant pull-up and pull-down devices for each of the latch nodes, a lower FIT rate—corresponding to a higher critical charge (Qcrit)—is achieved relative to a conventional latch structure.

An example is a master latch. The master latch includes a latch input node and a latch output node, a first inverter with an input and an output, the input coupled to the latch input node and the output coupled to the latch output node, and a second inverter with an input and an output, the input coupled to the latch output node and the output coupled to the latch input node. The master latch further includes a first pull-up device connected between a source voltage and the latch input node, the first pull-up device configured to pull the latch input node towards the source voltage when the latch output node is at a low voltage, and a first pull-down device connected between the latch input node and a ground voltage, the first pull-up device configured to pull the input patch node towards the ground voltage when the latch output node is at a high voltage.

In one example, the master latch also includes a second pull-up device connected between a source voltage and the latch output node, the second pull-up device configured to pull the output latch node towards the source voltage when the latch input node is at a low voltage, and a second pull-down device connected between the latch output node and a ground voltage, the second pull-down device configured to pull the latch output node towards the ground voltage when the latch input node is at a high voltage.

Another example is a single event upset (SEU) flip-flop. The SEU flip-flop includes a master latch coupled to a DICE slave latch. The master latch includes a latch input node and a latch output node, a first inverter with an input and an output, the input coupled to the latch input node and the output coupled to the latch output node, and a second inverter with an input and an output, the input coupled to the latch output node and the output coupled to the latch input node. The master latch further includes a first pull-up device connected between a source voltage and the latch input node, the first pull-up device configured to pull the latch input node towards the source voltage when the latch output node is at a low voltage, and a first pull-down device connected between the latch input node and a ground voltage, the first pull-down device configured to pull the input patch node towards the ground voltage when the latch output node is at a high voltage. The latch output node is coupled to an input of the DICE slave latch.

Another example is a method of providing a master latch. The method includes providing a latch input node and a latch output node, a first inverter with an input and an output, the input coupled to the latch input node and the output coupled to the latch output node, and a second inverter with an input and an output, the input coupled to the latch output node and the output coupled to the latch input node. The method further includes providing a first pull-up device connected between a source voltage and the latch input node, wherein the first pull-up device is configured to pull the input latch node to the source voltage when the latch output node is at a low voltage. The method still further includes providing a first pull-down device connected between the latch input node and a ground voltage, wherein the first pull-down device is configured to pull the input latch node to the ground voltage when the latch output node is at a high voltage.

In one example, the method further includes providing a second pull-up device connected between a source voltage and the latch output node, the second pull-up device configured to pull the output latch node towards the source voltage when the latch input node is at a low voltage, and providing a second pull-down device connected between the latch output node and a ground voltage, the second pull-down device configured to pull the latch output node towards the ground voltage when the latch input node is at a high voltage.

These and other aspects may be understood with reference to the following detailed description.

BRIEF DESCRIPTION OF DRAWINGS

So that the manner in which the above recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Examples described herein relate to integrated circuits with storage elements that that are resistant to SEU events. In particular, examples described herein include a master latch design for SEU Flip-Flops. The design includes partially redundant pull-up and pull-down devices for the latch nodes. Examples described herein may ensure a much lower Fit rate (high Qcrit) than that provided by conventional latch structures.

Figure 1:
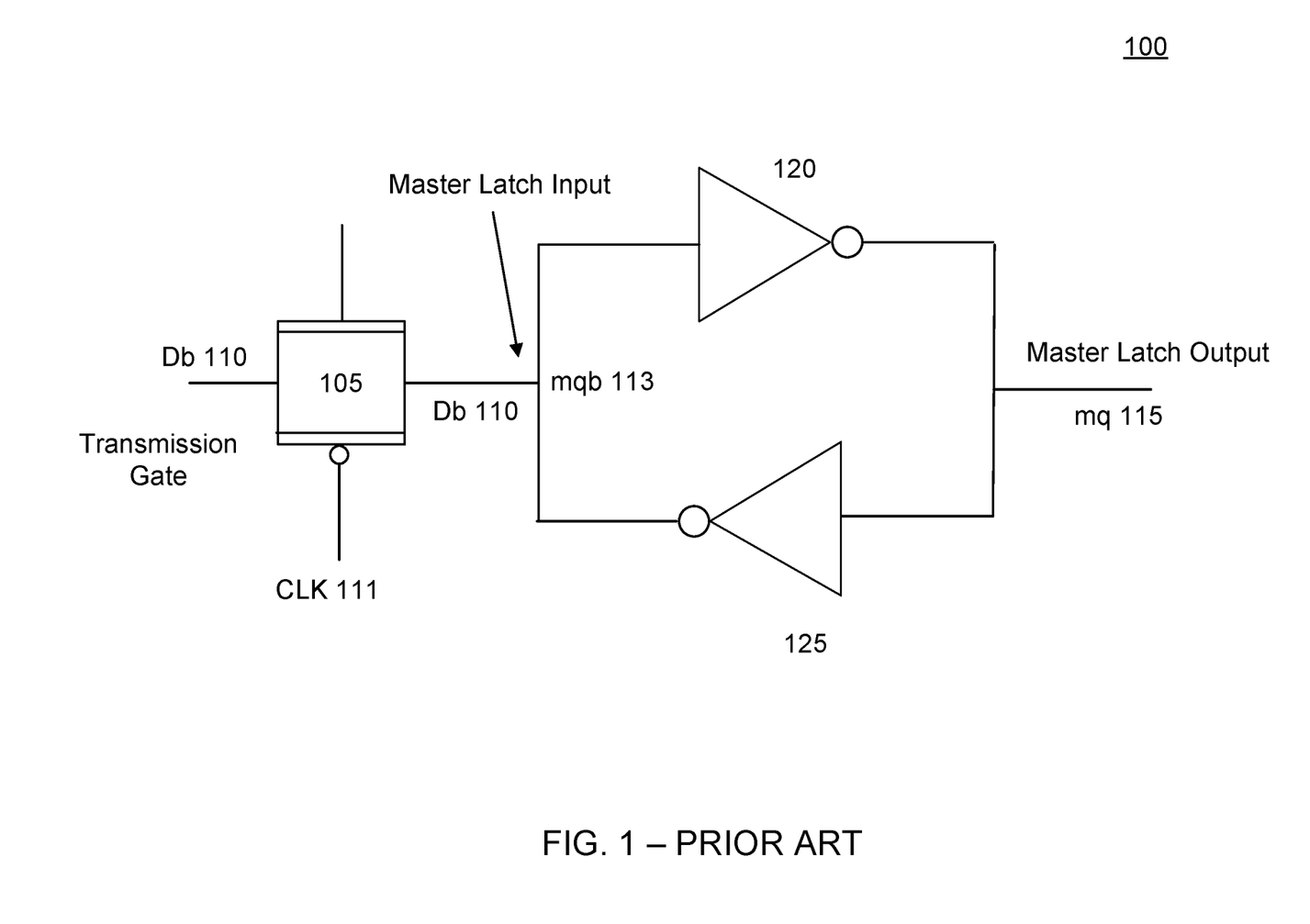
FIG. 1 depicts an example conventional master latch

FIG. 1 depicts an example conventional master latch. With reference thereto, there is an input signal Db 110, which, as indicated, is the inverse of an original input signal D (not shown). Db 110 is input to a transmission gate 105 (also known as a flop sampling gate), which, as shown, is clocked by a CLK signal 111. The clock signal enables the data Db 110 to pass through the transmission gate 105. Thus when the clock 111 is low, transmission gate 105 is open for data sampling, and passes Db 1109 and when the clock is high, the gate is closed, and the data that was sampled in the immediately prior clock cycle is stored in the latch. Transmission gate 105 may be formed out of, for example, two connected transistors, one PMOS and the other NMOS.

Continuing with reference to FIG. 1, from the transmission gate 105 the data Db 110 is input to a master latch input node mqb 113, as shown. The master latch input node mqb 113 is coupled to the input of a first inverter 120, and also to the output of a second inverter 125. Inverters 120 and 125 may be implemented using CMOS, for example. These two inverters, being cross connected as shown in FIG. 1, take input data, which is received at input node mqb 113 (also known as the "latch_QB" node of the master latch, or as just "latch_QB")), and output, on the output node mq 115 (also known as the "latch_Q" node of the master latch, or as just "latch_Q"), a complement or "bar" of the input data. Thus, if a "0" is input at mqb 113, a "1" is output at mq 115.

As noted above, the conventional master latch structure of FIG. 1 is vulnerable to SEU events. Thus, upon the occurrence of an SEU event, the data on its input node or its output node can flip, and thus generate an error. The structure is vulnerable to such bit flips if a SEU generated charge is high enough. Accordingly, the minimum value of a charge required to upset a given node is known as the "critical charge" or Qcrit. Similarly, a critical current generated by the flow of such a Qcrit charge, also known as a "critical current", is a useful index of the stability of a node of a storage device, such as, for example, a master latch.

Figure 2:
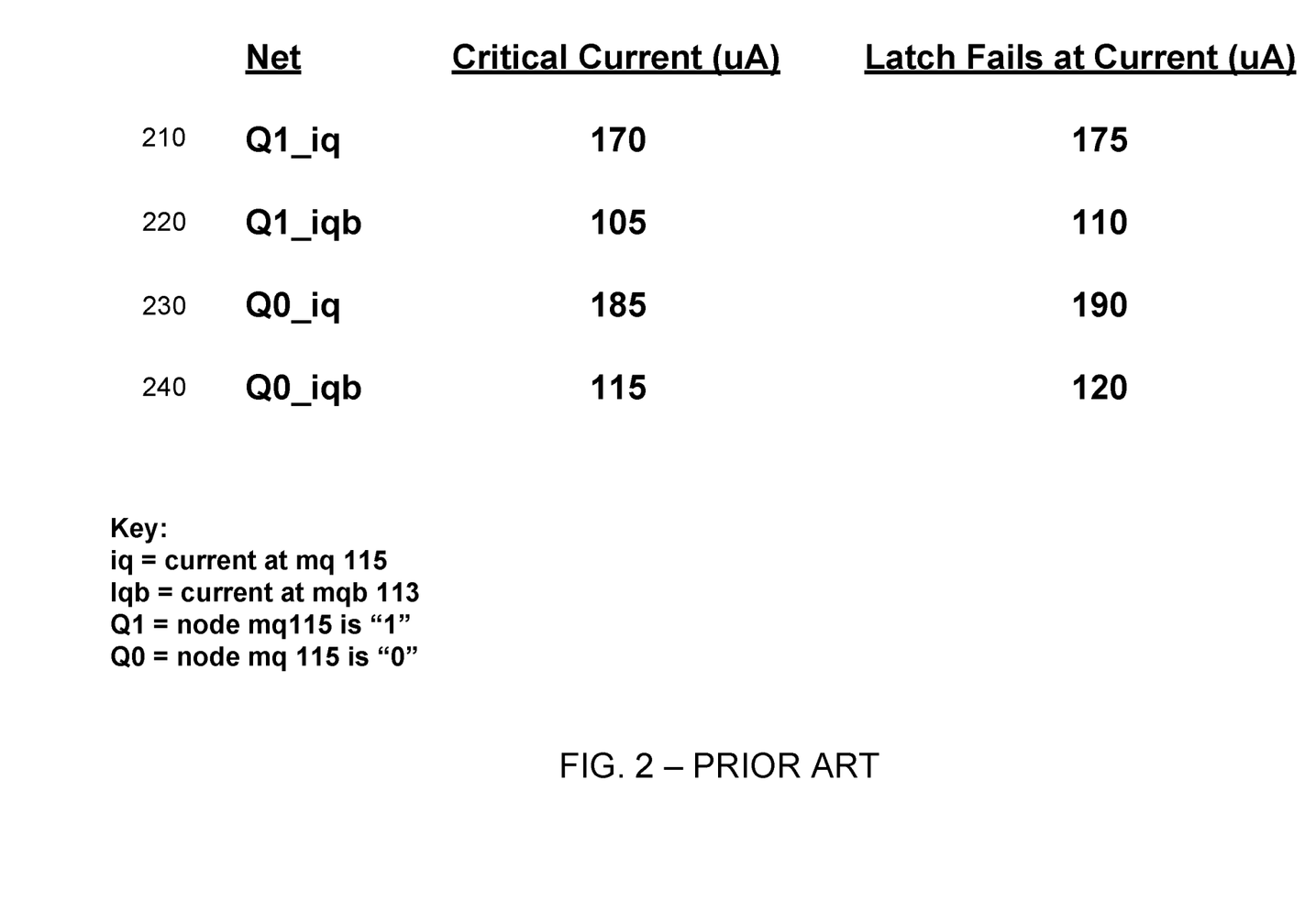
FIG. 2 provides critical current and latch fail currents at four nodes of the conventional master latch, such as is shown in FIG. 1.

FIG. 2 provides critical currents and latch fail currents at each of the two nodes (mqb 113 and mq 115) of the conventional master latch that is depicted in FIG. 1 for the high and low states of the node. The critical current is the maximum current that the latch is able to tolerate and yet still hold the correct state, whereas the latch fail current is the current at which the latch starts to fail. Thus, the latch fail current is generally a little higher than the critical current. In the nomenclature of FIG. 2, which is also used in FIG. 4, described below, "Q1" refers to the output node mq 115, or the latch_Q being high, a digital "1", and "Q0" refers to the output node mq 115, or the latch_QB, being low, a digital "0". Moreover, "iq" refers to a current at output node mq 115, whereas "iqb" refers to a current at input node mqb 113 (the "barred" node or latch_QB). It is noted that the input node latch_QB is the "bar" node, because the input signal D is inverted prior to being input to the transmission gate, and thus D becomes Db, which is input to the master latch at mqb 113. Because the master latch inverts its input, the master latch output, at mq 115, which is the complement of the already complemented Db bit, actually has the bit value of the original input D, and thus signal at mq 115 has no bar.

With reference to FIG. 2, beginning with top row 210, Q1_iq is a current injection at latch output mq 115 when mq 115=1, and thus mqb=0. If the current injection exceeds critical current 170 uA, then an error may occur. Similarly, the latch_Q fails at 175 uA. Continuing with row 220, Q1_igb is a current injection at latch input mqb 113 when mq 115=1, and thus mqb=0. If the current injection exceeds critical current 105 uA, then an error may occur at latch_QB. Similarly, the latch_QB fails at a current injection of 110 uA. Continuing with row 230. Q0_iq is a current injection at latch output mq 115 when mq 115=0, and thus mqb=1. If the current injection exceeds critical current 185 uA, then an error may occur. Similarly, the latch_Q fails at 190 uA. Finally, at row 240, Q0_iqb is a current injection at latch input mqb 113 when mq 115=0, and thus mqb=1. If the current injection exceeds critical current 115 uA, then an error may occur at latch_QB. Similarly, latch_QB fails at a current injection of 120 uA.

As seen in this data, the input node mqb 113, or latch_QB, is more vulnerable to injection currents than is output node mq 115. It is noted that the input node mqb 113 is more vulnerable than the latch_Q node, or mq 115, because it has lower capacitance. Thus, the same charge will cause a higher voltage which more easily upsets the latch's state. Moreover, there is a greater vulnerability when the latch_Q is high (the case 440 Q0_iqb, when latch_QB is low) due to the fact that front driver pull-up is relatively stronger than pull-down of the feedback driver. In one or more examples, making the Latch_Q and Latch_QB Qcrits closer to each other improves the latch Qcrit, inasmuch as latch Qcrit is gated by the weakest one. In one or more examples, this may be achieved through circuit sizing)

Thus, in accordance with one or more embodiments, if the critical currents of a master latch can be raised significantly from those shown in FIG. 2, then, in order to change a bit stored in the master latch, the now higher critical current is required, and thus the master latch becomes SEU protected. If this protection can be achieved without a significant increase in the size of the master latch—such as would be the case if the master latch was implemented, for example, as a DICE latch—then increased stability in return for a relatively low on-chip "real estate" cost may be achieved.

Figure 3:
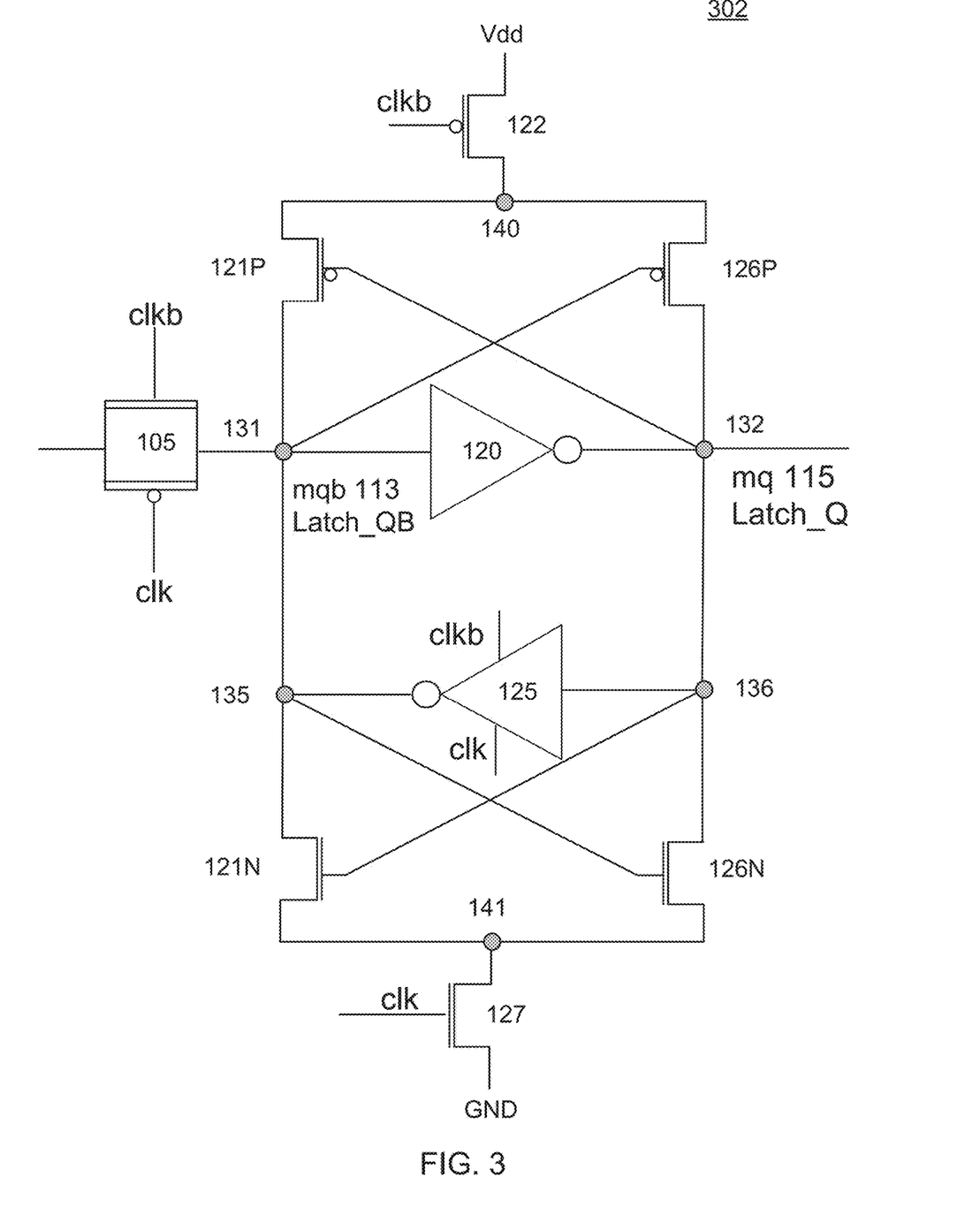
FIG. 3 depicts a SEU protected master latch, according to some examples.

FIG. 3 depicts an SEU protected master latch 302, according to some examples. As is shown in FIG. 3, there are two additional inverters added to the conventional master latch that is depicted in FIG. 1. As is next described in detail, in one or more examples, these additional inverters provide additional stability, and thus lower the FIT rate.

With reference to FIG. 3, there is shown an SEU protected master latch according to one or more examples. There are, as in all such master latches, two cross-connected inverters, a front driver inverter 120 and a feedback inverter 125. Feedback inverter 125 is gated by both clk and clkb signals, as shown. In addition to the standard pair of cross-connected inverters, two additional CMOS inverters have been added, a first inverter coupled to the input node 131, 135, and a second inverter coupled to the output node 132, 136. The first inverter includes PMOS transistor 121P and NMOS transistor 121N. PMOS transistor 121P has its source connected to node 140, which itself connects, via switching PMOS transistor 122, to a power source, and its drain is connected to node 131. NMOS transistor 121N has its source connected to node 141, which itself connects, via switching transistor 127, to ground, and its drain connected to node 135. Because nodes 131 and 135 are themselves connected, and both connected to input node mqb 113, the two drains of the first inverter are connected to the input node mqb 113 of the master latch.

Continuing with reference to FIG. 3, the second inverter includes PMOS transistor 126P and NMOS transistor 126N. PMOS transistor 126P has its source connected to node 140, which itself connects, via switching transistor 122, to a power source, and its drain is connected to node 132. NMOS transistor 126N has its source connected to node 141, which itself connects, via switching transistor 127, to ground, and its drain is connected to node 136. Because nodes 132 and 136 are themselves connected, and both connected to output node mq 115, the two drains of the second inverter are connected to the output node mq 115 of the master latch.

Additionally, the two respective gates of first additional inverter 121P/121N are also connected to nodes 132 and 136, which are the drains of the second additional inverter 126P/126N, and thus to output node mq 115. Similarly, the two respective gates of second additional inverter 126P/126N are also connected to the nodes 131 and 135, which are the drains of the first additional inverter 121P/121N, and thus to input node mqb 113.

The two additional inverters 121P/121N and 126P/126N, when each connected as described above, each provide a stabilizing pull-up and pull-down functionality to each of the input and output nodes, respectively, that holds the state of each such node, even when an SEU injection current tries to upset the state.

It is noted that transistors 122 and 127 function as switches for the two additional inverters 121P/121N and 126P/126N, respectively. PMOS switch transistor 122, connected to the sources of the PMOS transistors of each additional inverter, is clocked with a clkb signal that is input to its gate. NMOS switch transistor 127, connected to the sources of the NMOS transistors of each additional inverter, is clocked with a clk signal input to its gate, the complement of clkb. As shown in FIG. 3, only when clk=1, and thus clkb=0, after the completion of data sampling by the master latch, once the input data has been stored in the master latch, do switch transistors 127 and 122 turn on, the additional inverter pairs operate. Thus, during data sampling by the master latch, when clk=0 (and clkb=1), there is no current flow through additional transistors 121P/121N and 126P/126N. Once the data has been latched, then the first and second additional invertors operate to stabilize the data stored in the latch from SEU events, as next described.

Continuing further with reference to FIG. 3, for each of the (latch, state) four example cases listed in FIG. 2, the stabilizing function of the relevant additional inverter is next described.

Beginning with a first case (Q1_iq), where latch_Q is 1, and thus mq 115=1 and mqb 113=0, there is a current injection at mq 115. The potentially problematic injection is a negative current, which will transform to a negative voltage, and the negative voltage level depends on the charge that is then stored at mq 115.

Moreover, the negative voltage induced by the current injection tries to pull output node mq 115 down to low through the PMOS transistor of inverter 125 ("125(P)") and the PMOS transistor 121P, to the NMOS transistor of inverter 120 ("120(N)") and the NMOS transistor 126N. At the same time, in addition to element 120(P) operating to hold mq 115 at 1, with the additional inverter coupled to the output node mq 115, now transistor 126P also works to hold node mq 115 at 1 as well, which makes the latch more immune to SEU upset. Transistor 126P is "on" due to the input to its gate, which is coupled to mqb 113, being low. Transistor 126P thus connects node mq 115 to source voltage Vdd, pulling it up. Thus, due to the additional stability of transistor 126P, a higher Qcrit is observed at node mq 115.

Continuing with a second case (Q1_iqb), where latch_Q is 1, and thus mq 115=1 and mqb 113=0, with an injection current at mqb 113. Here the injection is positive current, which will transform to positive voltage on mqb 113, and try to switch it to a 1. The positive voltage level depends on the charge stored at mqb 113. Moreover, the positive voltage induced by the current injection tries to pull mq 113 to high through 120(P) and the NMOS transistor 126N, to the PMOS transistor 125(P) and the PMOS transistor 121P. At the same time, in addition to element 125(N) operating to hold mqb 113 at its actual state of 0, now with the additional inverter coupled to the output node mqb 113, transistor 121N also works to hold node mqb 113 at 0 as well, which makes the latch more immune to SEU upset. Transistor 121N is "on" due to the input to its gate, which is coupled to mq 115, being low. Transistor 121N thus connects node mqb 113 to ground voltage GND, pulling it down. Thus, due to the additional stabilization of transistor 121N, a higher Qcrit is observed at node mqb 113.

In the third case, (Q0_iq), where latch_Q is 0, and thus mq 115=0 and mqb 113=1, there is a current injection at node mq 115. The current injection is positive current, which will transform to positive voltage, trying to pull mq 115 high. The positive voltage level depends on the charge stored at mq 115. Moreover, the positive voltage induced by the current injection at output node mq 115 tries to pull mq 115 high through 125(N) and transistor 121N to 120(P) and transistor 126P. At the same time, in addition to transistor 120(N) to hold mq 115 at 0, transistor 126N, which is "on" because the input to its gate, tied to node 135, is high, because mqb 113=1, as noted. Thus, transistor 126N also operates to hold mq 115 low, which makes the latch more immune to this type of SEU upset. As a result, a higher Qcrit is observed at node mq 115 in this case.

In the fourth case, (Q0_iqb), latch_Q is 0, and thus node mq 115=0 and node mqb 113=1. The current injection in this example case is at mqb 113, and the injection is negative current which will transform to negative voltage, and try to flip node iqb 113 from 1 to 0. The negative voltage level depends on charge stored at node mqb 113. As noted, the negative voltage induced by the current injection is trying to pull mqb 113 to low through 120(P) and 126P to 125(N) and 121N. At the same time, in addition to element 125(P) to hold mqb 113 high, transistor 121P, which is "on" because the input to its gate, tied to node 132, is low, because mq 115=0, as noted. Thus, transistor 121P is working to hold "mqb 113" high as well, by creating current flow between Vdd and node mqb 113, which makes the latch more immune to SEU upset. Thus, due to the additional stabilization of transistor 121P, a higher Qcrit is observed at node mqb 113 in this fourth case as well.

In general, the stability is needed to hold the state of a node against injection currents induced by an SEU event which act to try and upset the state. Because, as described above, upsetting the state requires current going through the full latch loop, simply doubling the size of inverters 120 and 125 will not improve SEU protection. This is because inverter properties such as, for example, P/N strength, feedback loop strength, and feedback resistance, are all ratioed and only a small gain can be achieved from such doubling.

In one or more examples, adding the additional inverters as shown in FIG. 3 provides the master latch circuit with additional capability to hold the state when an injection current is induced. To illustrate some examples of that effect, FIG. 4 provides critical current and latch fail currents at the two nodes of the latch for each of the high and low states, as depicted in FIG. 2, but for the SEU protected master latch illustrated in FIG. 3, according to some examples.

Figure 4:
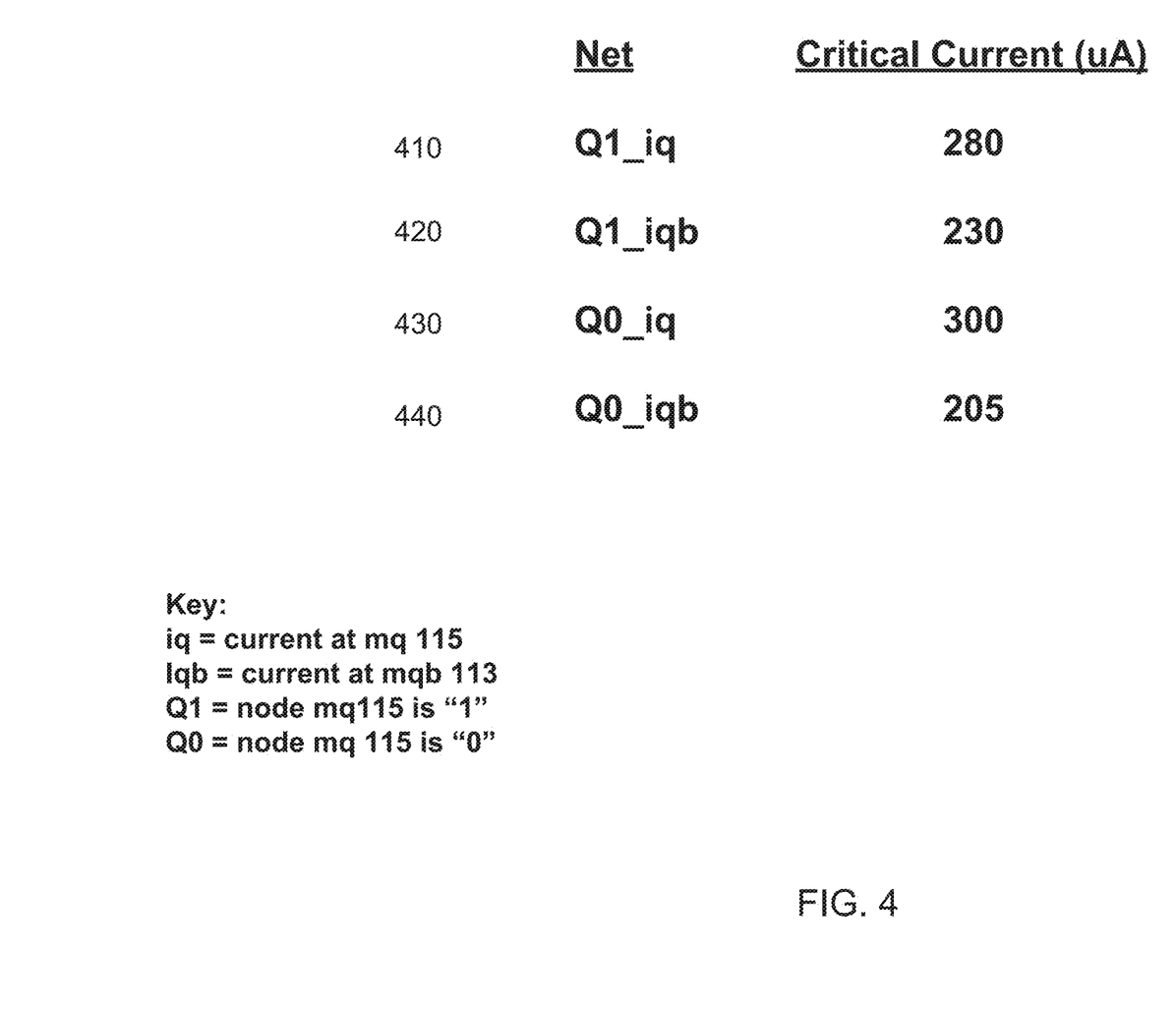
FIG. 4 provides critical current and latch fail currents at the same four nodes as depicted in FIG. 2, but for the SEU protected master latch shown in FIG. 3, according to some examples.

The example Qcrit values shown in FIG. 4 were obtained by the inventors, from measurements performed on a prototype master latch, and thus represent actual data. In what follows, these experimentally obtained Qcrit values are compared to the Qcrit values as measured on a conventional master latch, which are presented in FIG. 2. With reference to FIG. 4, beginning with top row 410, the case Q1_iq involves a current injection at latch output node mq 115 when mq 115=1. The critical current has here increased, relative to the value provided in FIG. 2, from 170 uA to 280 uA, an increase of more than 65%. Continuing with row 420, Q1_igb involves a current injection at latch input node mqb 113 when mq 115=1, and thus mqb=0. Here the critical current has increased from 105 uA to 230 uA, an increase of approximately 120%. Continuing with row 430, Q0_iq is a current injection at latch output node mq 115 when mq 115=0. The critical current has increased from 185 uA to 300 uA, an increase of approximately 65%. Finally, at row 440, Q0_iqb is a current injection at latch input node mqb 113 when latch output node mq 115=0, and thus latch input node mqb=1. Here the critical current has increased from 115 uA to 205 uA, an increase of more than 80%.

Thus, in accordance with one or more embodiments, the critical currents of the nodes of a master latch may be significantly raised by adding additional pull-up and push-down devices coupled to each node, such as, for example a pair of additional inverters, one provided at the master latch input node mqb 113, and the other provided at the master latch output node mq 115. In one or more examples, when augmented in this way, the master latch is thus SEU protected, and this protection may be achieved with a small increase in master latch size, such as, for example, an area penalty of 4%. In one or more examples, the higher critical currents mean a lower FIT rate.

Figure 5A:
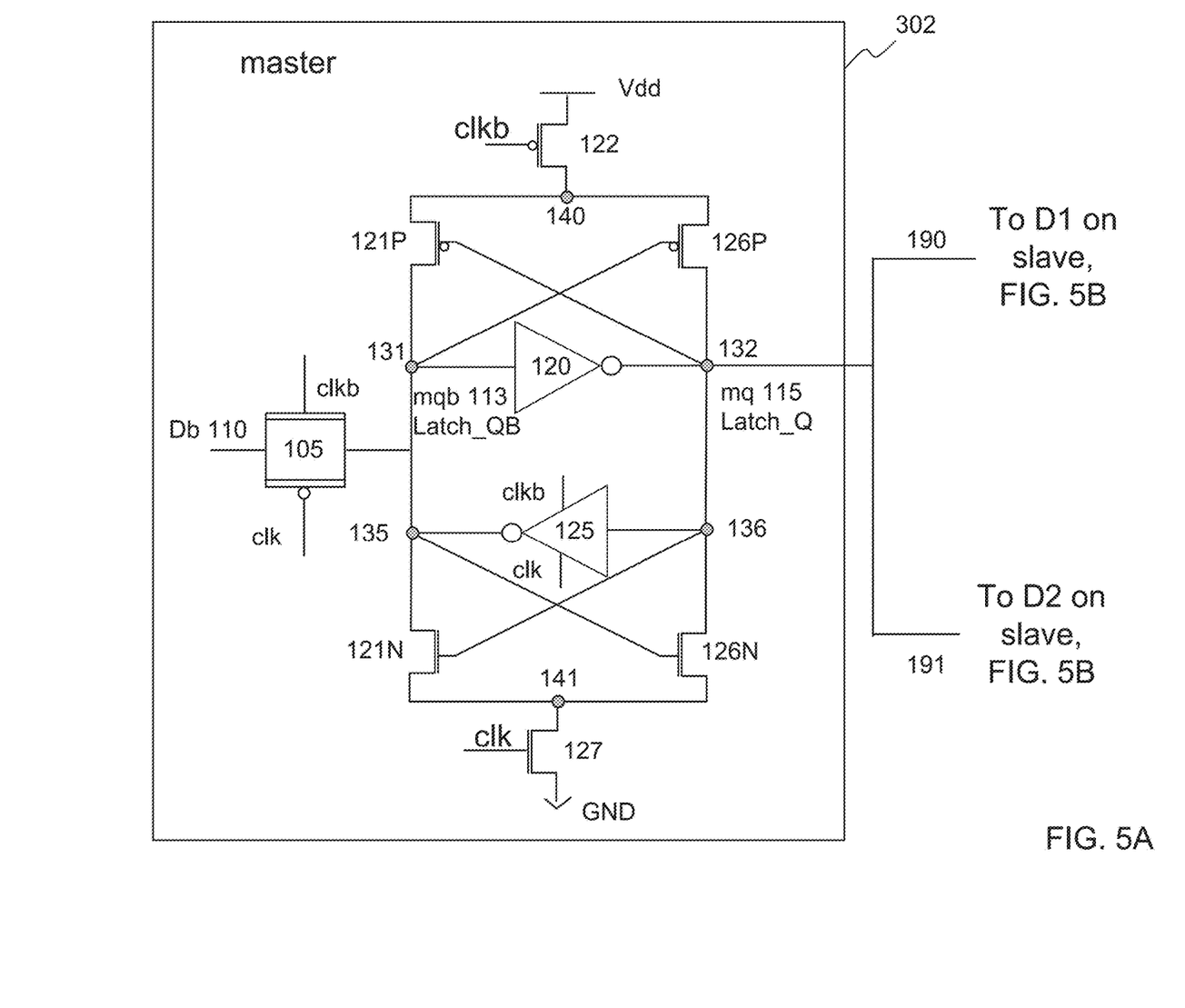
FIG. 5A depicts the master latch of FIG. 3, as connected to an example DICE slave latch, according to some examples.
Figure 5B:
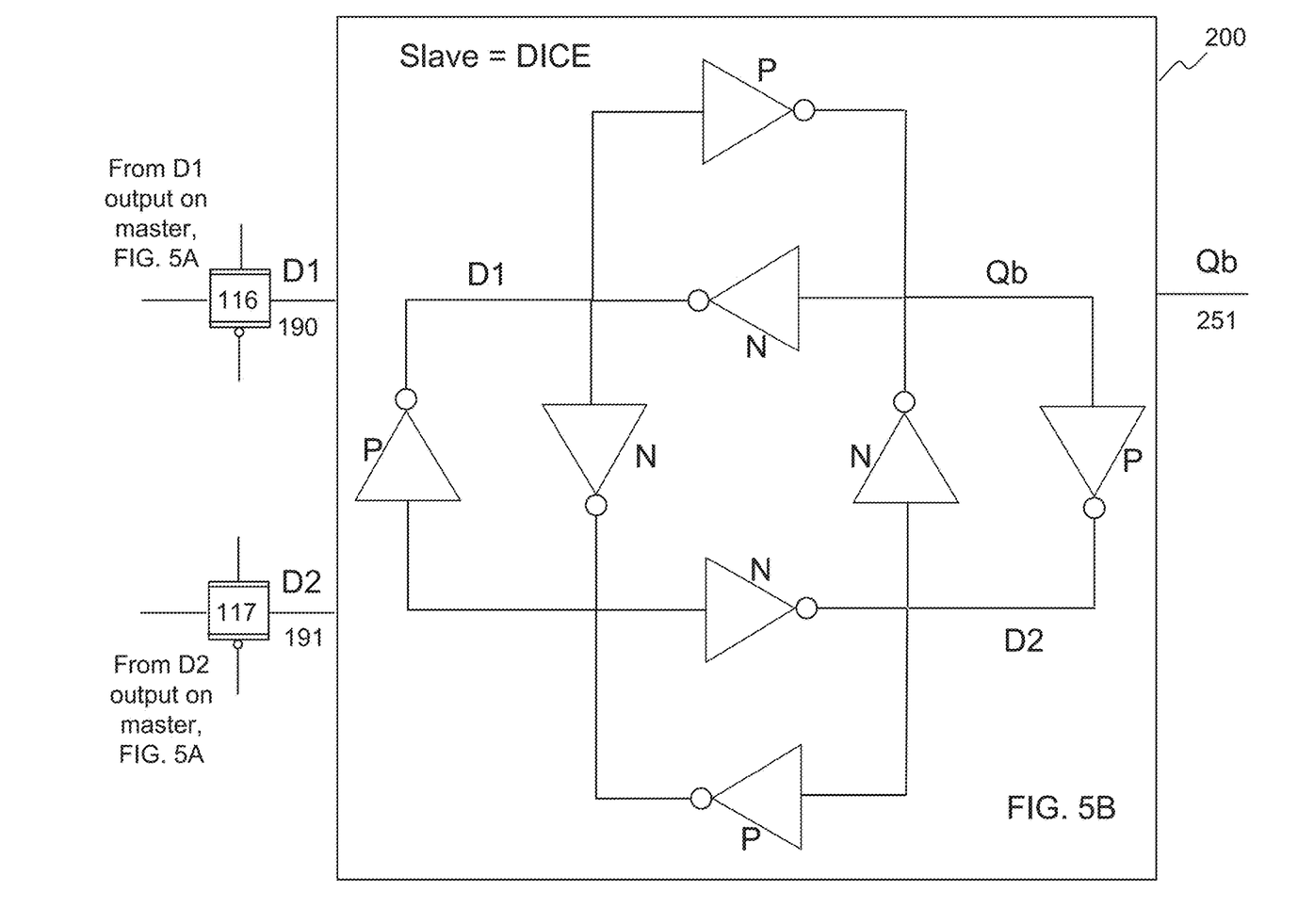
FIG. 5B depicts the example DICE slave latch to which the master latch of FIG. 5A is connected, according to some examples.

FIGS. 5A and 5B, next described, depict the example master latch 302 of FIG. 3 as connected to an example DICE slave latch, to form a complete flip-flop, according to some examples. FIG. 5A illustrates the example master latch of FIG. 3, with an input Db 110. Because the example master latch 302 was already described above, it shall not be described again here. It is noted, however, that the master latch's output node mq 115 (latch_Q) is connected to two inputs of an example slave latch, shown in FIG. 5B. Thus, the signal on the output node mq 115 is fed, via connection 190 to input D1 on the example slave latch, and also, via connection 191, to input D2 on the example slave latch.

FIG. 5B depicts an example slave latch 200 to which the master latch 302 of FIG. 5A may be connected, according to some examples. Example slave latch 200 is implemented as a DICE slave latch, and is thus, due to its duplicate and inter-lock structure, already fully protected. Thus, each node of slave latch 200 has a high Qcrit.

Continuing with reference to FIG. 5B, the two signals emanating from master latch output node mq 115, via connections 190 and 191, respectively, are each input to transmission gates 116 and 117, respectively. The output of transmission gate 116 is coupled to input D1 of slave latch 200, and similarly, the output of transmission gate 117 is coupled to input D2 of slave latch 200. Transmission gates 116 and 117 are closed when clk=0 (flop input data sampling) and open when clk=1 (flop data sent to slave latch). As shown, the output of the slave latch 200 is Qb 251. Qb 251 is an inverted version of slave latch 200 inputs D1 and D2, which are each the mq 115 output of master latch 302. However, because mq 115 is the inverted version of master latch input mqb 113, which is the same signal as Db 110, Qb 251 has the same polarity as Db 110. Thus, in one or more examples, to obtain the original input D (not shown), slave latch output Qb 251 may be input to an additional inverter (not shown).

In connection with DICE slave latch 200 it is noted that by adding redundant latch and special connections, the DICE latch may be understood conceptually as a four-inverter loop. There are two pairs of Q nodes and QB nodes. The probability of latch disruption due to current injection at any of the four latch nodes is lower than that due to current injection at one of the two latch nodes for a regular latch.

Given the use of the master latch according to one or more examples, such as, for example, is shown in FIG. 3, and the DICE latch of FIG. 5B as the slave, both master and slave are fully protected in a combined flip-flop made of both latches. It is noted, however, that while the DICE slave 200 has a higher SEU protection than the example master latch of FIG. 3, this comes at the cost of a much larger on-chip area, which is not the case for the added protection to the master latch in accordance with various examples. Moreover, the example master latch 302 also has improved clock to q timing, due to the doubling of the driver by gating both transistor 122 and transistor 127 with complementary clock signals. In some embodiments, the master latch may be 5% faster as a result. Additionally, in one or more examples, because the additional two inverters added to the master latch do not need to implement set/reset control, which is in the main part of the master latch, e.g., inverters 120 and 125 in FIG. 5A, the area penalty for the two additional inverters may be small, such as, for example, 4%. Finally, the addition of the two additional inverters has negligible impact on power usage, in as much as these inverters are added to the master latch, which is not free running. The negligible impact on power usage of the addition of the two additional inverters is for the following reasons. A flop with set and/or reset needs to have greater stack in inverters 120 and 125. However, there is no corresponding need to add stack to the additional pull-up and pull-down devices 121P, 121N, 126P and 126N. Thus, adding the additional inverters is different from simply doubling the latch. Moreover, in one or more examples, the added pull-up and pull-down transistors 121P, 126P, and 121N, 126N are respectively gated by clock signals clkb and clk. Thus, they have little impact on dynamic current or leakage current, because these added devices represent a very small fraction of the total overall circuitry.

Figure 6:
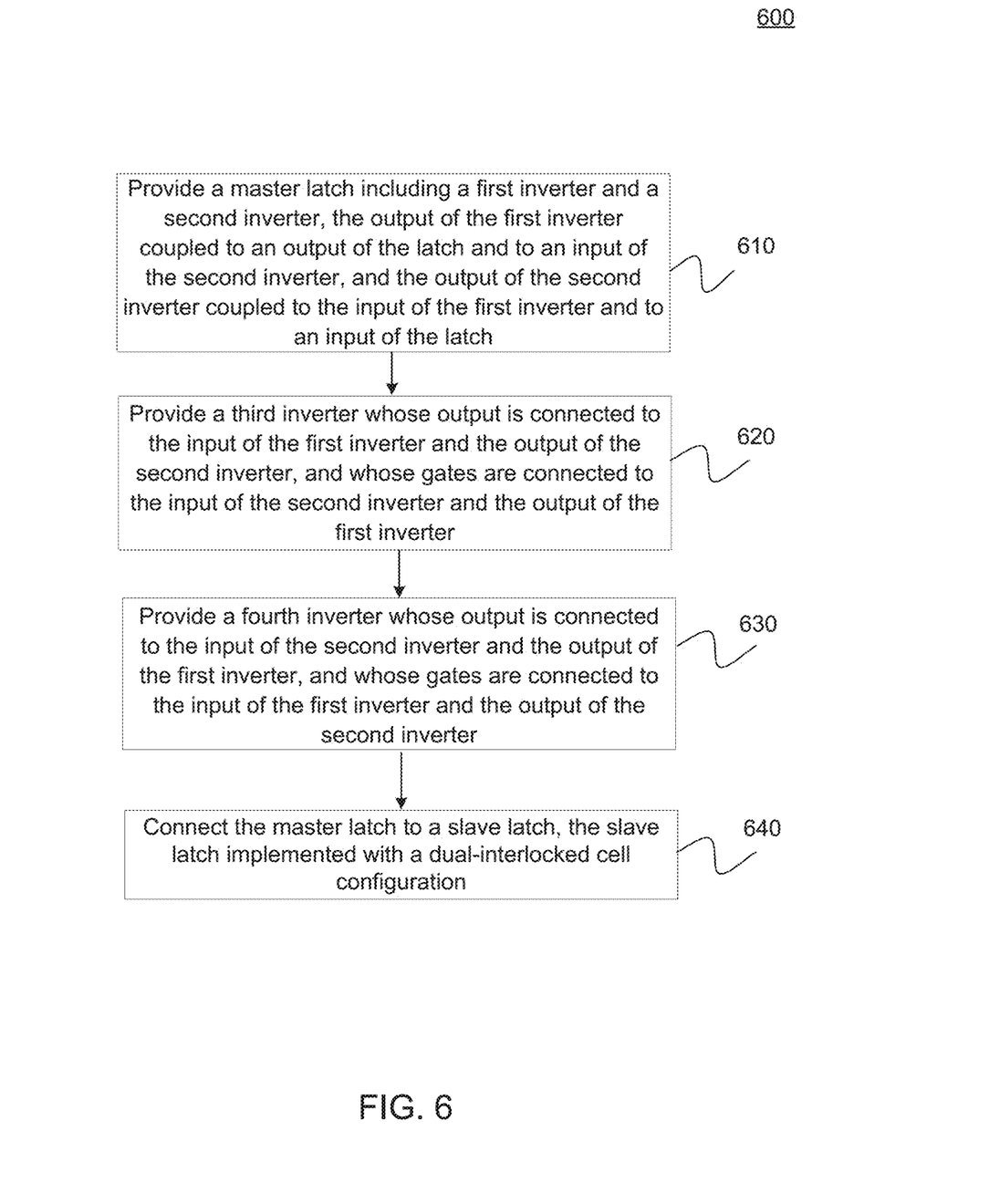
FIG. 6 is a flow diagram of a method of providing a SEU master latch, according to some examples.

FIG. 6 is a flow diagram of a method 600 for providing a SEU protected master latch, according to some examples.

Method 600 includes blocks 610 through 640. In alternate examples method 600 may include greater, or fewer, blocks. Method 600 begins at block 610, where a master latch is provided, the master latch including a first inverter and a second inverter, the output of the first inverter coupled to an output of the latch and to an input of the second inverter, and the output of the second inverter coupled to the input of the first inverter and to an input of the latch. For example, the inverters may be CMOS inverters.

From block 610 method 600 proceeds to block 620, where a third inverter is provided, the output of the third inverter connected to the input of the first inverter and the output of the second inverter, and the gates of the third inverter connected to the input of the second inverter and the output of the first inverter.

From block 620 method 600 proceeds to block 630, where a fourth inverter is provided. The output of the fourth inverter is connected to the input of the second inverter and the output of the first inverter, and the gates of the fourth inverter are connected to the input of the first inverter and the output of the second inverter.

For example, the third and fourth inverters may also be CMOS inverters, and they may be substantially equivalent in size, parameters and performance to each of the first inverter and the second inverter.

From block 630 method 600 proceeds to block 640, where the master latch is connected to a slave latch, the slave latch implemented with a dual-interlocked cell configuration. Method 600 terminates at block 640.

Figure 7:
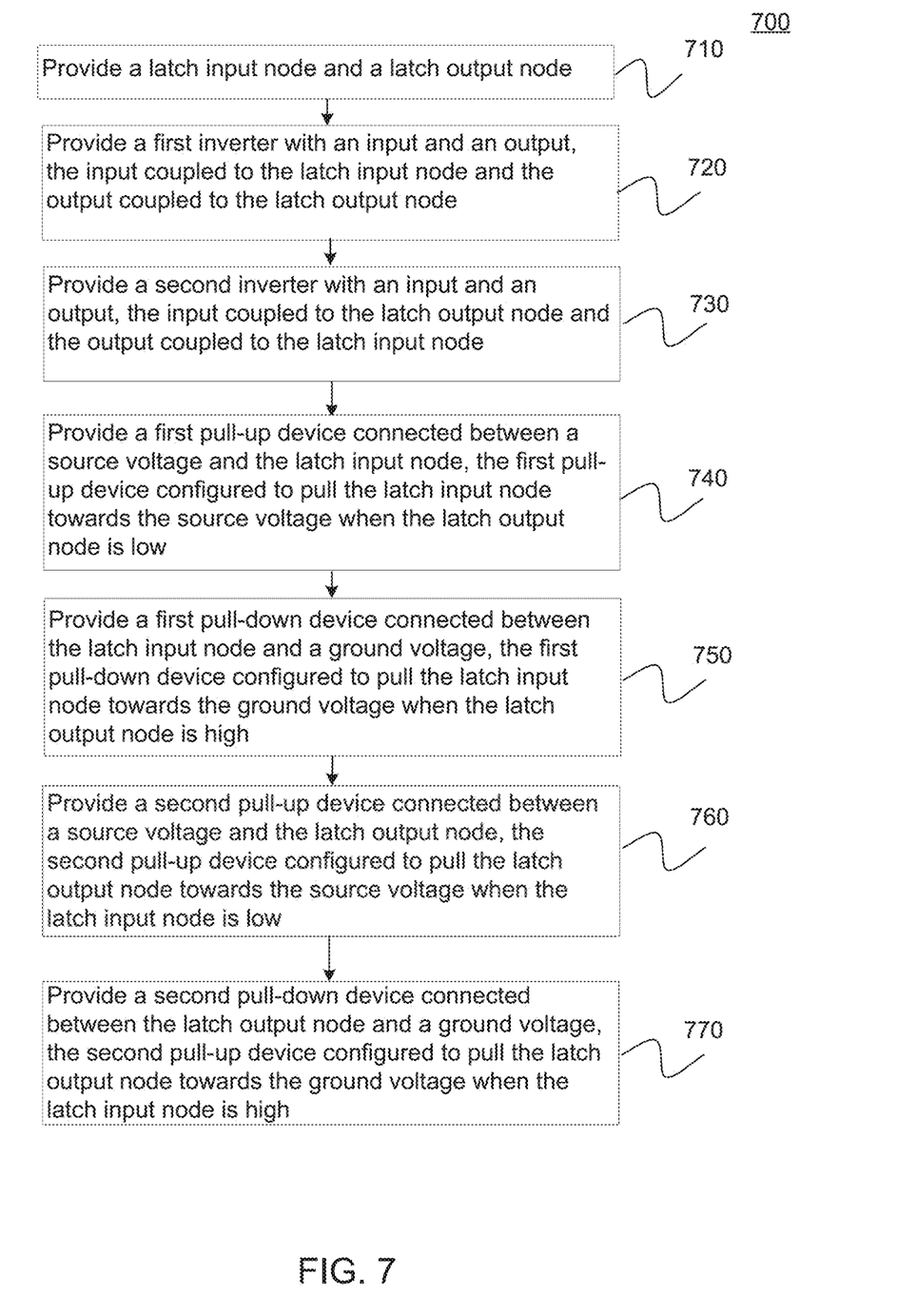
FIG. 7 is a flow diagram of an alternate method of providing a SEU master latch, according to some examples.

FIG. 7 is a flow diagram of an alternate method 700 for providing a SEU protected master latch, according to some examples. Method 700 includes blocks 710 through 770. In alternate examples method 700 may include greater, or fewer, blocks. Method 700 begins at block 710 where a latch input node and a latch output node are provided.

From block 710, method 700 proceeds to block 720, where a first inverter is provided, the first inverter having an input and an output, and the input coupled to the latch input node and the output coupled to the latch output node. For example, the first inverter may be inverter 120 of FIG. 3.

From block 720, method 700 proceeds to block 730, where a second inverter is provided, the second inverter having an input and an output, and the input coupled to the latch output node and the output coupled to the latch input node. For example, the second inverter may be inverter 125 of FIG. 3, the two inverters cross-connected, as shown in FIG. 3.

From block 730, method 700 proceeds to block 740, where a first pull-up device is connected between a source voltage and the latch input node, the first pull-up device configured to pull the latch input node towards the source voltage when the latch output node is low. For example, the first pull-up device may be transistor 121P of FIG. 3.

From block 740, method 700 proceeds to block 750, where a first pull-down device is connected between the latch input node and a ground voltage, the first pull-down device configured to pull the latch input node towards the ground voltage when the latch output node is high. For example, the first pull-down device may be transistor 121N of FIG. 3.

From block 750, method 700 proceeds to block 760, where a second pull-up device is connected between a source voltage and the latch output node, the second pull-up device configured to pull the latch output node towards the source voltage when the latch input node is low. For example, the second pull-up device may be transistor 126P of FIG. 3.

From block 760, method 700 proceeds to block 770, where a second pull-down device is connected between the latch output node and a ground voltage, the first pull-down device configured to pull the latch output node towards the ground voltage when the latch input node is high. For example, the second pull-down device may be transistor 126N of FIG. 3.

Method 700 terminates at block 770.

Thus, as described above, according to one or more examples, a master latch for SEU flip-flops may be provided. By adding redundant pull-up and pull-down devices for each of the latch nodes, such as, for example, a pair of inverters, one connected to each node, a lower FIT rate—corresponding to a higher critical charge (Qcrit)—may be achieved relative to a conventional latch structure. Moreover, the example master latch 302 also has improved timing, due to the doubling of the driver. In some embodiments, the master latch may be 5% faster as a result. Additionally, in one or more examples, because the additional two inverters added to the master latch do not need to implement set/reset control, which is in the main part of the master latch, e.g., inverters 120 and 125 in FIG. 5A, the area penalty for the two additional inverters, e.g., 121P/121N and 126P/126N, may be small, such as, for example, 4%. Finally, the addition of the two additional inverters has negligible impact on power usage, inasmuch as these inverters are added to the master latch, which is not free running.

In one or more examples, each of the redundant pull-up and pull-down devices that are added may be a COMS inverter, including a PMOS transistor as pull-up device, and a NMOS transistor as pull-down device. In such examples, the PMOS and NMOS transistors making up the inverter are connected at their drains, as shown, for example, in FIG. 3, where node 131 is that of the drain of PMOS transistor 121P and node 135, which is coupled to node 131, is that of the drain of NMOS transistor 121N. Similarly, node 132 is that of the drain of PMOS transistor 126P and node 136, which is coupled to node 132, is that of the drain of NMOS transistor 126N. It is noted that in one or more examples, the additional inverters are not required to be the same as the original inverters that make up the master latch. Thus, for example, the inverter 121P/121N need not be the same as inverters 120 and 125. Moreover, the two additional inverters need not be the same size either. Thus, inverter 126P/

126N need not be the same size as inverter 126P/126N, and neither of the inverters 121P/121N or 126P/126N need be the same size as each other, or as inverters 120, 125. In one or more examples, sizing of the additional inverters, both relative to each other, and relative to latch inverters 120, 125, may be optimized to have a balanced Qcrit at the input and output latch nodes, e.g., latch_Q and latch_QB, which is a preferred implementation. This is because the overall master latch Qcrit is gated by the weakest latch.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to specific examples, other and further examples may be devised without departing from the basic scope thereof, and the scope thereof is determined by the claims that follow.

What is claimed is:

1. A master latch, comprising:
 a latch input node;
 a latch output node;
 a first inverter with an input and an output, the input of the first inverter coupled to the latch input node and the output of the first inverter coupled to the latch output node;
 a second inverter with an input and an output, the input of the second inverter coupled to the latch output node and the output of the second inverter coupled to the latch input node;
 a first pull-up device connected between a source voltage and the latch input node, the first pull-up device configured to pull the latch input node towards the source voltage when the latch output node is low;
 a first pull-down device connected between the latch input node and a ground voltage, the first pull-down device configured to pull the latch input node towards the ground voltage when the latch output node is high;
 a second pull-up device connected between the source voltage and the latch output node, the second pull-up device configured to pull the output latch node towards the source voltage when the latch input node is low; and
 a second pull-down device connected between the latch output node and the ground voltage, the second pull-down device configured to pull the latch output node towards the ground voltage when the latch input node is high;
 wherein the first pull-up device and the second pull-up device are coupled to the source voltage through a first transistor that has an input clocked by a first clock signal, and wherein the first Dull-down device and the second Dull-down device are coupled to the ground voltage through a second transistor that has an input clocked by a second clock signal, and wherein the second clock signal is a complement of the first clock signal.

2. The master latch of claim 1, wherein the first pull-up device is integrated with the first pull-down device.

3. The master latch of claim 2, wherein the integrated first pull-up device and first pull down device is a first CMOS inverter, whose output is coupled to the latch input node, and whose input is coupled to the latch output node.

4. The master latch of claim 1, wherein the second pull-up device is integrated with the second pull-down device.

5. The master latch of claim 4, wherein the integrated second pull-up device and second pull down device is a second CMOS inverter, whose output is coupled to the latch output node, and whose input is coupled to the latch input node.

6. The master latch of claim 1, wherein:
 the first pull-up device and first pull down device are integrated in a first CMOS inverter, whose output is coupled to the latch input node, and whose input is coupled to the latch output node; and
 the second pull-up device and second pull down device are integrated in a second CMOS inverter, whose output is coupled to the latch output node, and whose input is coupled to the latch input node.

7. The master latch of claim 6, wherein each of the first CMOS inverter and the second CMOS inverter are connected at their respective PMOS and NMOS sources.

8. The master latch of claim 7, wherein the connected PMOS sources are coupled to the source voltage through the first transistor and wherein the connected NMOS sources are coupled to the ground voltage through the second transistor.

9. The master latch of claim 8, further comprising a transmission gate coupled to the latch input node, the transmission gate driven by both clk and clkb.

10. The master latch of claim 6, wherein at least one of:
 transistors of the first CMOS inverter have different sizes than transistors of the second CMOS inverter;
 transistors of the first CMOS inverter have different sizes than transistors of the first inverter and the second inverter; or
 transistors of the second CMOS inverter have different sizes than transistors of the first inverter and the second inverter.

11. A method of providing a master latch, comprising:
 providing a latch input node and a latch output node;
 providing a first inverter with an input and an output, the input of the first inverter coupled to the latch input node and the output of the first inverter coupled to the latch output node;
 providing a second inverter with an input and an output, the input of the second inverter coupled to the latch output node and the output of the second inverter coupled to the latch input node;
 providing a first pull-up device connected between a source voltage and the latch input node, the first pull-up device configured to pull the latch input node towards the source voltage when the latch output node is low; and
 providing a first pull-down device connected between the latch input node and a ground voltage, the first pull-down device configured to pull the latch input node towards the ground voltage when the latch output node is high;
 providing a second pull-up device connected between the source voltage and the latch output node, the second pull-up device configured to pull the output latch node to the source voltage when the latch input node is low; and
 providing a second pull-down device connected between the latch output node and the ground voltage, the second pull-up device configured to pull the latch output node to the ground voltage when the latch input node is high;
 coupling the first pull-up device and the second pull-up device to the source voltage through a first transistor that has an input clocked by a first clock signal, and
 coupling the first pull-down device and the second pull-down device to the ground voltage through a second transistor that has an input clocked by a second clock signal, wherein the second clock signal is a complement of the first clock signal.

12. The method of claim 11, further comprising:
connecting the master latch to a slave latch implemented as a dual-interlocked storage cell.

13. The method of claim 11, wherein the first pull-up device is integrated with the first pull-down device.

14. The method of claim 13, wherein the integrated first pull-up and first pull-down device is a first CMOS inverter, and further comprising coupling an output of the first CMOS inverter to the latch input node, and an input of the first CMOS inverter to the latch output node.

15. The method of claim 11, wherein the second pull-up device is integrated with the second pull-down device.

16. The method of claim 15, wherein the integrated second pull-up and second pull-down device is a second CMOS inverter, and further comprising coupling an output of the second CMOS inverter to the latch output node, and an input of the second CMOS inverter to the latch input node.

17. A single event upset (SEU) flip-flop, comprising:
a master latch and a slave latch coupled to at least one output of the master latch, the master latch comprising:
a first inverter and a second inverter, an output of the first inverter coupled to an output of the master latch and to an input of the second inverter, and an output of the second inverter coupled to an input of the first inverter;
a third inverter, an output of the third inverter coupled to the input of the first inverter and the output of the second inverter, and an input of the third inverter coupled to the input of the second inverter and to the output of the first inverter;
a fourth inverter, an output of the fourth inverter coupled to the input of the second inverter and to the output of the first inverter, and an input of the fourth inverter coupled to the input of the first inverter and to the output of the second inverter,
wherein the slave latch is implemented in a dual interlocked cell (DICE) configuration, and
wherein at least one of:
PMOS sources of the third inverter and the fourth inverter are connected to a source voltage through an upper gating transistor, whose gate is driven by a first clock signal;
NMOS sources of the third inverter and the fourth inverter are connected to ground through a lower gating transistor, whose gate is driven by a second clock signal;
the first clock signal is a complement of the second clock signal; or
the first clock signal and the second clock signal are additionally used to gate the second inverter.

18. The SEU flip-flop of claim 17, wherein each of the third and fourth inverters are CMOS inverters, connected at their respective PMOS sources to the source voltage, and connected at their respective NMOS sources to ground.

* * * * *

UNITED STATES PATENT AND TRADEMARK OFFICE
CERTIFICATE OF CORRECTION

PATENT NO. : 11,177,795 B1
APPLICATION NO. : 16/855962
DATED : November 16, 2021
INVENTOR(S) : Jun Liu and Bruce Young It is certified that error appears in the above-identified patent and that said Letters Patent is hereby corrected as shown below:

In the Claims

Column 11, Line 52, In Claim 1, delete "Dull-down" and insert -- pull-down --, therefor.

Column 11, Line 53, In Claim 1, delete "Dull-down" and insert -- pull-down --, therefor.

Signed and Sealed this
Thirty-first Day of October, 2023

*Katherine Kelly Vidal*

Katherine Kelly Vidal
*Director of the United States Patent and Trademark Office*